US 6,581,174 B2

(12) United States Patent
Stubbs

(10) Patent No.: US 6,581,174 B2
(45) Date of Patent: *Jun. 17, 2003

(54) ON-CHIP TESTING CIRCUIT AND METHOD FOR INTEGRATED CIRCUITS

(75) Inventor: Eric T. Stubbs, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/944,750

(22) Filed: Aug. 31, 2001

(65) Prior Publication Data

US 2002/0026606 A1 Feb. 28, 2002

Related U.S. Application Data

(63) Continuation of application No. 09/106,813, filed on Jun. 29, 1998, now Pat. No. 6,286,115.

(51) Int. Cl.$^7$ .......................... G11C 29/00; G01R 31/28
(52) U.S. Cl. ..................... 714/718; 714/734; 324/158.1
(58) Field of Search ................... 714/718, 710, 714/724, 725, 733, 734, 736; 324/158.1, 537

(56) References Cited

U.S. PATENT DOCUMENTS

| 4,969,148 A | 11/1990 | Nadeau-Dostie et al. ... 714/718 |
| 5,400,343 A | 3/1995 | Crittenden et al. .......... 714/721 |
| 5,553,082 A | 9/1996 | Connor et al. ............... 714/733 |
| 5,659,508 A | 8/1997 | Lamphier et al. ........... 365/201 |
| 5,659,748 A | 8/1997 | Kennedy ........................ 713/2 |
| 5,787,096 A | 7/1998 | Roberts et al. ............. 714/718 |
| 5,936,974 A | 8/1999 | Roberts et al. ............. 714/718 |
| 6,085,346 A | 7/2000 | Lepejian et al. ............ 714/733 |
| 6,286,115 B1 * | 9/2001 | Stubbs ........................ 714/718 |

OTHER PUBLICATIONS

Ayukawa et al., "An Access–Sequence Control Scheme to Enhance Random–Access Performance of Embedded DRAM's," *IEEE Journal of Solid–State Circuits*, vol. 33(5): 800–806, May 1998.

* cited by examiner

*Primary Examiner*—Emmanuel L. Moise
(74) *Attorney, Agent, or Firm*—Dorsey & Whitney LLP

(57) ABSTRACT

An integrated circuit includes an embedded memory device and an on-chip test circuit. The on-chip test circuit includes a multiplexer and one or more I/O circuits. The multiplexer allows the I/O circuits to interface with a plurality of inputs and outputs associated with the embedded memory device. As a result, the embedded memory device in the integrated circuit may be tested or repaired after the embedded memory array portion of the integrated circuit is formed, yet prior to fabrication of dedicated input/output circuitry. This allows evaluation of the embedded memory device in the integrated circuit prior to committing resources to complete fabrication of the entire integrated circuit.

35 Claims, 3 Drawing Sheets

ON-CHIP TESTING CIRCUIT AND METHOD FOR INTEGRATED CIRCUITS

CROSS-REFERENCE TO RELATED APPLICATION

This application is a continuation of U.S. patent application Ser. No. 09/106,813, filed Jun. 29, 1998 now U.S. Pat. No. 6,286,115B1.

TECHNICAL FIELD

The present invention relates generally to testing of integrated circuits, and more specifically to a method and apparatus that permits accessing of memory arrays embedded in the integrated circuits independent of any embedded logic arrays associated with the integrated circuits.

BACKGROUND OF THE INVENTION

FIG. 1 is a simplified block diagram of an integrated circuit 10 according to the prior art. The integrated circuit 10 includes an embedded memory device 12, also known as a matrix memory device 12, together with spare or redundant memory cells 12'. The embedded memory device 12 is coupled through an internal bus 14 to an embedded logic array 16 that is also coupled to I/O circuitry 18 dedicated to the embedded logic array 16. As used herein, the term "embedded," as applied to circuitry contained on the integrated circuit 10, refers to a circuit having one or more associated busses that are not normally directly accessible from outside of the integrated circuit 10.

In operation, the I/O circuitry 18 couples control and data signals from external circuitry (not illustrated) to the embedded logic array 16. The embedded logic array 16 operates on the data signals in accordance with the control signals and generates intermediate or final results. These results are coupled from the embedded logic array 16 through the internal bus 14 and are stored in the embedded memory device 12. The embedded logic array 16 recalls these results at a later time and uses them to generate output signals that are then coupled from the integrated circuit 10 to the external circuitry through the embedded logic array 16 and the I/O circuitry 18. While the above-described arrangement provides great advantages in achieving high data transfer rates between the memory device 12 and the logic circuitry 16, it only permits the embedded memory device 12 to be externally accessed through the embedded logic array 16. In other words, unless the embedded logic array 16 is operational, the embedded memory device 12 cannot be easily accessed for purposes such as testing. Further, the embedded memory device 12 may only be tested with those tests that are pre-programmed into the embedded logic array 16 or through the I/O circuitry 18 of the embedded logic array 16.

The internal bus 14 includes 'N' data lines, where N may be large, e.g., the internal bus 14 may be 64, 128, 256 or 512 bits wide or may be even wider. When the internal bus 14 is wide or very wide, it is impractical to provide I/O pads dedicated to each bit or data line of the internal bus 14. Furthermore, if the I/O pads 24 are to be connected to externally accessible terminals, then buffers, electrostatic discharge protection and other circuitry (not illustrated) must be provided for each data line of the internal bus 14. Yet this additional circuitry for each data line would consume unacceptably large portions of the integrated circuit 10 in order to provide external access to all of the data lines of the internal bus 14.

In many applications, the embedded memory device 12 is formed prior to forming the embedded logic array 16 for several different reasons. Many memory circuits, such as the embedded memory device 12, require smaller linewidths (i.e., minimum feature sizes) than are necessary for the embedded logic array 16, in order for the embedded memory device 12 to provide data storage densities consistent with economical fabrication of the integrated circuit 10. Also, the processing steps required to fabricate the embedded memory device 12 may be different than those required to fabricate the embedded logic array 16. These reasons, particularly in combination, often favor fabricating the embedded memory device 12 prior to fabricating the embedded logic array 16.

A typical embedded memory device 12 in an integrated circuit 10 includes at least one array of memory cells (not illustrated) arranged in rows and columns. Each memory cell must be tested to ensure that it is operating properly. In a typical prior art test method, data having a first binary value (e.g., a "1") are written to and read from all memory cells in the arrays, and thereafter data having a second binary value (e.g., a "0") are typically written to and read from the memory cells. The data written to the memory cells are known as "write" data, and the data read from the memory cells are known as "read" data. The read data are compared to a corresponding set of expect data. The expect data correspond to read data that would be provided by the integrated circuit 10 if its embedded memory device 12 was operating properly. A memory cell is considered to be defective when the read data and the corresponding expect data do not agree. As understood by one skilled in the art, other test data patterns may be utilized in testing the memory cells, such as an alternating bit pattern, e.g., 101010 . . . , written to the memory cells in each row of the memory device 12.

Defective memory cells that are identified by testing are replaced with non-defective memory cells from rows or columns of spare or redundant memory cells 12'. In one conventional method for replacing defective memory cells, fuses on the integrated circuit 10 are blown in a pattern corresponding to the addresses of defective memory cells. The pattern is then compared to incoming addresses to select the rows or columns of redundant memory cells 12' to replace rows or columns in the memory device 12 containing the defective memory cells.

However, it is desirable to be able to test the embedded memory device 12 before the embedded logic array 16 has been formed. When fabrication yields for the embedded memory device 12 are poor, or when fabrication yields decrease, it may be undesirable to fabricate the embedded logic array 16 and combine it with the memory device 12 prior to testing the memory device 12. Further, discovering fabrication problems early in forming the integrated circuit 10 allows corrective steps to be taken early, reducing the number of integrated circuits 10 affected by a particular fabrication problem. Early detection of fabrication problems favors increased yields and reduced waste.

Accordingly, there is a need for an on-chip test circuit to permit testing of embedded memory devices in integrated circuits prior to fabrication of dedicated logic circuits for the integrated circuits.

SUMMARY OF THE INVENTION

In one aspect of the present invention, an integrated circuit includes an embedded memory device coupled to an internal bus having a first number of data lines, a multiplexer and an I/O port having a second number of data lines that is less than the first number of data lines. The multiplexer allows the I/O port to be coupled to a portion of the data lines of the internal bus and thus to at least a portion of the embedded memory device. As a result, the embedded memory device may be tested or repaired before an embedded logic function associated with dedicated I/O pins or pads is added to the integrated circuit. This promotes improved economic efficiency by allowing a manufacturer to cull integrated circuits that do not have acceptable fabrication yields prior to fabrication of the embedded logic array.

DETAILED DESCRIPTION OF THE INVENTION

Figure 1:
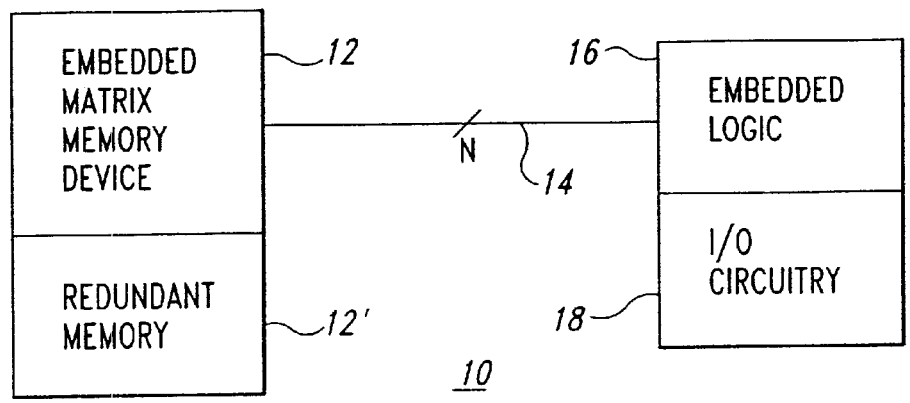
FIG. 1 is a simplified block diagram of an integrated circuit according to the prior art.
Figure 2:
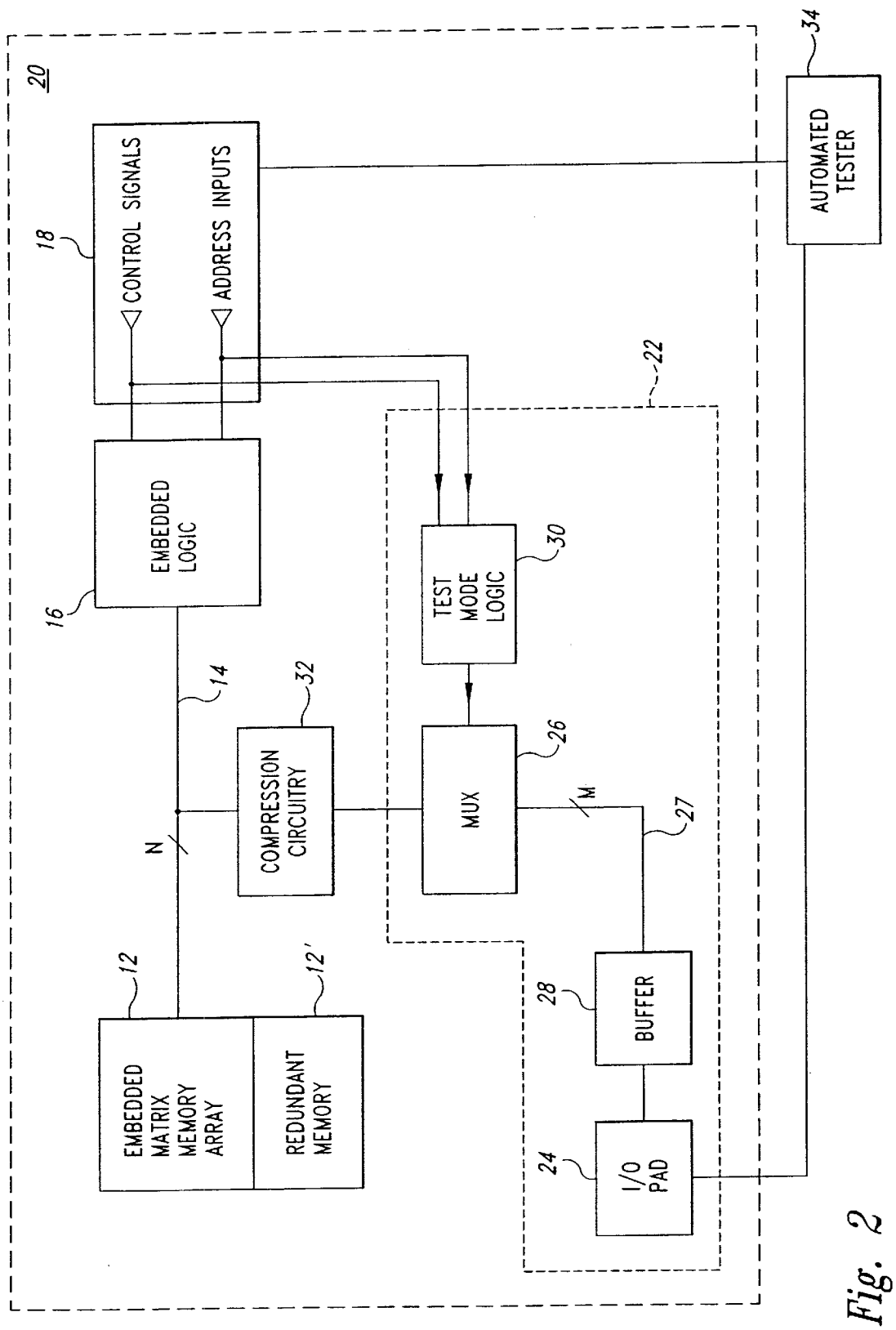
FIG. 2 is a simplified block diagram of an integrated circuit including an on-chip testing circuit in accordance with an embodiment of the present invention.

FIG. 2 is a simplified block diagram of an integrated circuit 20 including an on-chip testing circuit 22 in accordance with an embodiment of the present invention. The integrated circuit 20 includes the embedded memory device 12 coupled to the on-chip testing circuit 22 and may include the embedded logic array 16 as described above in association with FIG. 1. In one embodiment, the embedded memory device 12 includes a memory circuit such as a dynamic random access memory ("DRAM"). The on-chip testing circuit 22 includes I/O pins or pads 24 and a multiplexer ("MUX") 26. The on-chip testing circuit 22 includes a bus 27 that couples a bi-directional buffer 28 to a first set of data ports of the MUX 26 and to the I/O pins or pads 24.

In one embodiment, the I/O pads 24 are shared by the testing circuit 22 and the I/O circuitry 18, i.e., the I/O pads 24 are a subset of the I/O circuitry 18. As a result, the same I/O pads 24 and/or pins can be used for testing and for normal operations.

The I/O pins or pads 24, the bus 27, the bi-directional buffer 28 and the first set of data ports of the MUX 26 each include 'M' digital data lines, which is substantially fewer than the 'N' data lines of the internal bus 14. In one embodiment, M may be related to N as in $M=N/2^n$. For example, M might be 16 while N might be 512, i.e., n=five, however, M may be any number greater than or equal to one, but typically will be less than thirty-two. The on-chip test circuit 22 also includes a test mode logic circuit 30 having inputs coupled to the I/O circuitry 18 and having outputs coupled to the MUX 26. The test mode logic circuit 30 provides control signals to the MUX 26 to select a subset of the N data lines of the internal data bus 14 to be coupled to the M I/O pins or pads 24. In one embodiment, a subset of M of N second data ports of the MUX 26 is coupled to a corresponding subset of M of the N data lines of the internal bus 14. In another embodiment, a subset of M data ports of the MUX 26 is coupled to a multiple of M of the N data lines of the internal bus 14 through optional compression circuitry 32.

In some applications, the I/O pins or pads 24 are accessed through probes by an automated tester 34 prior to completion of packaging of the integrated circuit 20, allowing testing of the embedded memory device 12 while the integrated circuit 20 is still in wafer form. The embedded memory device 12 may be repaired, as discussed above, and the repair of the embedded memory device 12 may precede fabrication of the embedded logic array 16. In other embodiments, the I/O pins or pads 24 may be bonded to pins in the completed, packaged integrated circuit 20, providing external access to the embedded memory device 12 even in the event that the embedded logic array 16 is not functional. Bonding the I/O pads 24 to package pins also permits a broader range of tests than those tests that are preprogrammed into the embedded logic array 16 to be applied to the embedded memory device 12.

Figure 3:
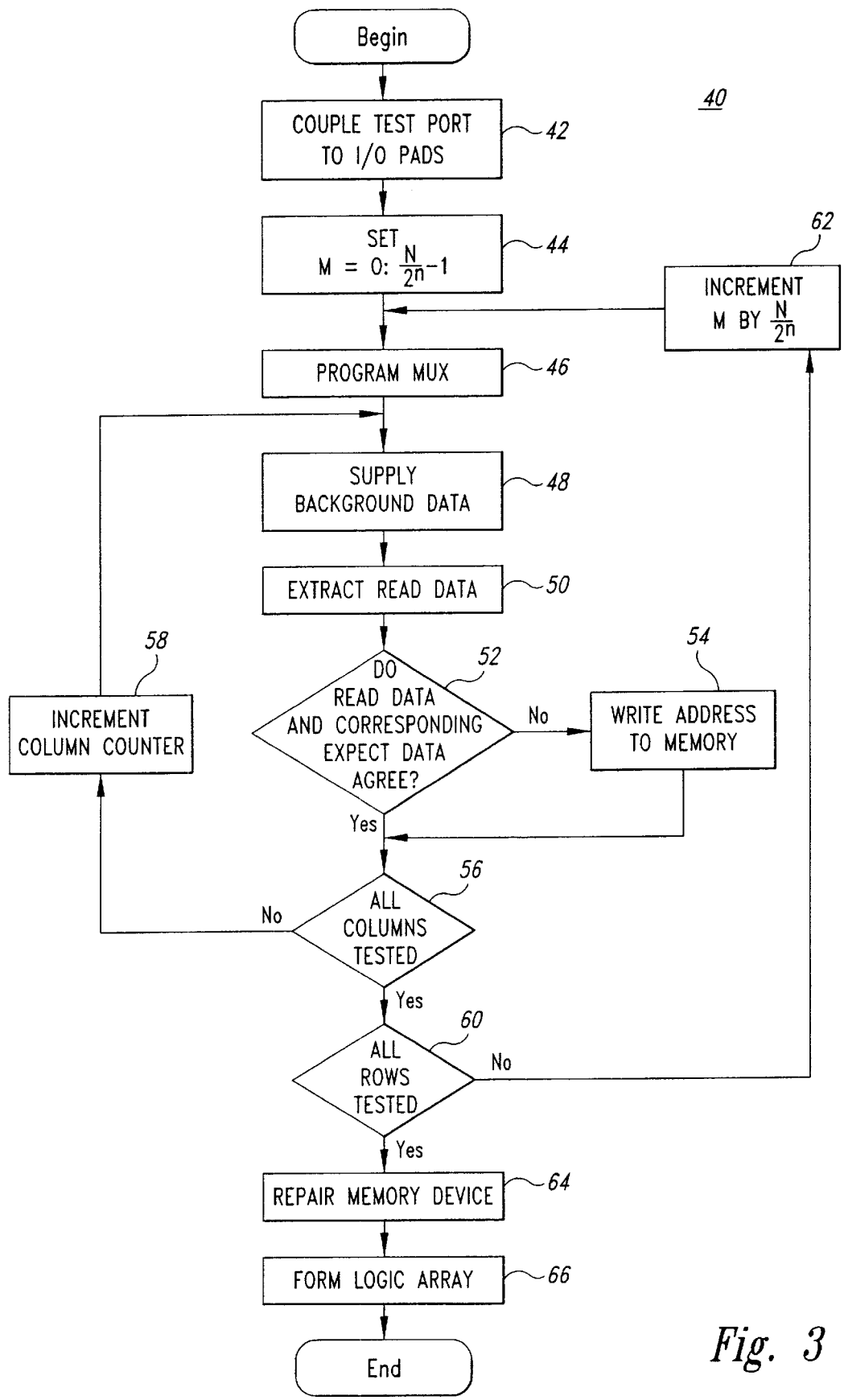
FIG. 3 is a flow chart of a process for forming the integrated circuit of FIG. 2 in accordance with an embodiment of the present invention.

FIG. 3 is a flow chart of a process 40 for forming the integrated circuit 20 of FIG. 2 according to an embodiment of the present invention. The process 40 begins after the embedded memory device 12 has already been formed. In a step 42, a test port on a tester, such as the automated tester 34, is coupled to the I/O pads 24. In one embodiment, a probe card having a number of probes is used to make temporary connections to the I/O pads 24. Any other temporary connections (power supply, control signals for the MUX 26 etc.) required to be able to test the embedded memory device 12 are also made to the integrated circuit 20. In a step 44, a group of index variables m are selected that correspond to addresses for a first group of rows $(0:N/2^n-1)$ that form a portion of the embedded memory device 12 selected for testing. In a step 46, the MUX 26 is programmed to couple the selected rows to the I/O pads 24. In a step 48, background data are supplied to the selected rows of the embedded memory device 12. In a step 50, read data are extracted from the selected portion of the embedded memory device 12 through the I/O pads 24. In a query task 52, the automated tester 34 determines if the read data and the corresponding expect data agree.

When the query task 52 determines that the read data and the corresponding expect data do not agree, data describing the failed memory cell (e.g., the cell address) are written to a memory in the automated tester in a step 54. When the query task 52 determines that the read data and the corresponding expect data do agree, control passes to a query task 56.

The query task 56 determines if all of the columns in the embedded memory device 12 have been tested. When the query task 56 determines that not all of the columns in the embedded memory device 12 have been tested, control passes to a step 58. In the step 58, a column counter is incremented and control then returns to the step 48. When the query task 56 determines that all of the columns in the embedded memory device 12 have been tested, control passes to a query task 60.

The query task 60 determines if all of the rows in the embedded memory device 12 have been tested. When not all of the rows in the embedded memory device 12 have been tested, control passes to a step 62. In the step 62, the control signals to the MUX 26 are incremented. In one embodiment, the control signals to the MUX 26 are incremented to test the rows adjacent to the rows that have just been tested. Since $M=N/2^n$, the index variables m corresponding to the rows being addressed are incremented by $N/2^n$ in this embodiment. When all of the rows in the embedded memory device 12 have been tested, control passes to a step 64.

In the step 64, the embedded memory device 12 is repaired. In one embodiment, the defective memory cells in the embedded memory device 12 are replaced in a conventional manner by blowing fuses or antifuses in a pattern corresponding to addresses of rows or columns including the defective memory cells that were identified in the query task 52. Antifuses are devices that are initially nonconductive but which may be stressed or "blown" by an appropriate bias to become permanently conductive.

In a step 66, the embedded logic array 16 and the remainder of the integrated circuit 20 are formed through conventional fabrication procedures. The process 40 then ends.

In a different embodiment of the process 40, some data compression is employed in testing the embedded memory device 12. For example, in the step 46, not only are M many rows selected by the MUX 26, but an additional group of rows is also selected by the optional compression circuitry 32. The additional group of rows might include, e.g., another M many rows, or it might include, e.g., another 3M many rows. In the step 48, background data are supplied to all of the selected rows via the optional compression circuitry 32. In the step 50, combinatorial logic in the optional compression circuitry 32 combines the read data from all of the selected rows such that the query task 52 is able to determine that one of the several rows corresponding to one of the M I/O pads 24 includes a defective memory cell. In one embodiment, the several rows associated with the I/O pad 24 carrying the data indicative of a memory cell failure are replaced with a group of rows from the redundant memory cells 12' to repair the embedded memory device 12. This embodiment provides some speed advantages in testing of the embedded memory device 12.

It will be appreciated that variations in the process 40 are possible. For example, the steps relating to rows could be steps relating to columns and vice versa.

Figure 4:
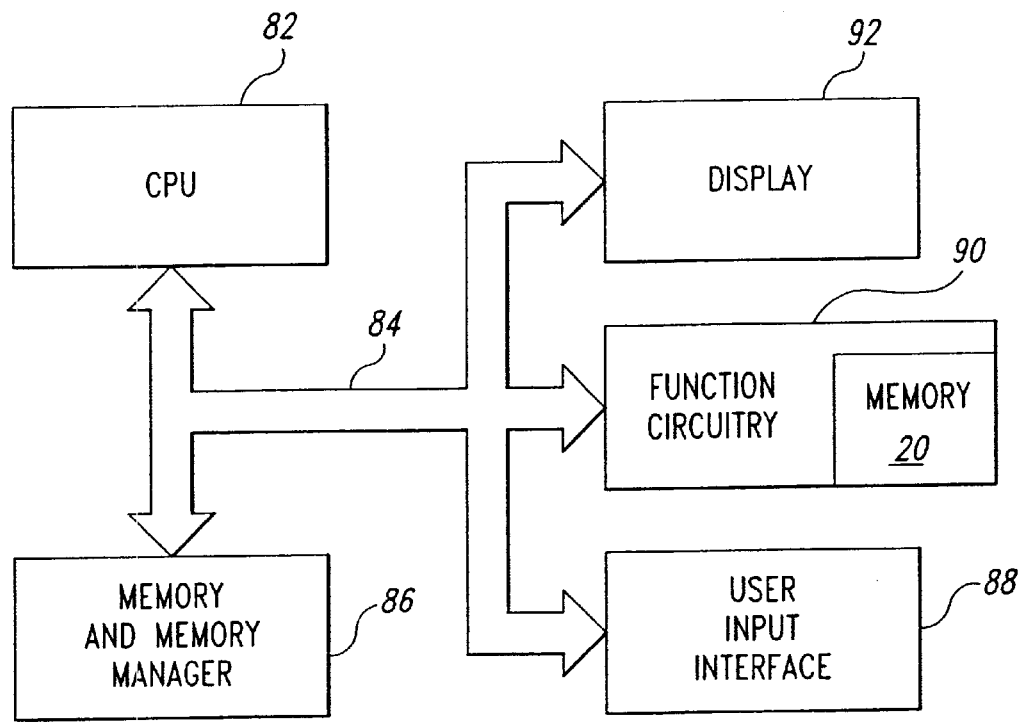
FIG. 4 is a simplified block diagram of a computer system including the integrated circuit of FIG. 2 in accordance with an embodiment of the present invention.

FIG. 4 is a simplified block diagram of a portion of a computer system 80 including the memory integrated circuit 20 of FIG. 2 in accordance with an embodiment of the present invention. The computer system 80 includes a central processing unit 82 for performing various computing functions, such as executing specific software to perform specific calculations or tasks. The central processing unit 82 is coupled via a bus 84 to a memory 86, a user input interface 88, such as a keyboard or a mouse, function circuitry 90 and a display 92. The memory 86 may or may not include a memory management module (not illustrated). The memory 86 does include ROM for storing instructions providing an operating system and also includes read-write memory for temporary storage of data. The processor 82 operates on data from the memory 86 in response to input data from the user input interface 88 and displays results on the display 92. The processor 82 also stores data in the read-write portion of the memory 86.

The function circuitry 90 is an example where the integrated circuit 20 of FIG. 2 may be particularly effective. For example, when the function circuitry 90 includes an encryption engine, a digital signal processing chip (e.g., video processor, vocoder, 3-dimensional computer graphics, image processing or the like) or provides some other dedicated or programmable complex function, as described, for example, in "An Access-Sequence Control Scheme to Enhance Random-Access Performance of Embedded DRAMs," by K. Ayukawa et al., *IEEE Journal of Solid State Circuits* 33(5):800–806, 1998, the integrated circuit 20 will include both read-write memory functions and logic functions, such as those provided by the embedded memory device 12 and the embedded logic array 16, respectively (see FIGS. 1 and 2). In turn, these functions may be realized least expensively when the embedded memory device 12 can be evaluated prior to completing fabrication of the embedded logic array 16.

Examples of systems where the computer system 80 finds application include personal/portable computers, camcorders, televisions, automobile electronic systems, microwave ovens and other home and industrial appliances.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A method of testing an integrated circuit including an internal bus having 'N' data lines and an embedded memory device coupled to the internal bus, the method comprising:

providing a test circuit including a multiplexer having 'N' first data ports each coupled to a respective one of the N data lines of the internal bus and 'M' second data ports, where 'M' is less than 'N', a controller coupled to the multiplexer, and 'M' I/O ports each coupled to a respective one of the 'M' second data ports of the multiplexer;

transmitting a control signal from the controller to the multiplexer to select a subset of 'M' of the 'N' data lines in the internal bus to be coupled to the 'M' second data ports of the multiplexer; and coupling a data signal from at least one of the 'M' second data ports of the multiplexer to a respective one of the 'M' I/O ports.

2. The method of claim 1 wherein at least one of the test circuit or the integrated circuit includes a data compression circuitry having 'N' data ports coupled to the 'N' data lines of the internal bus and 'M' data ports coupled to the 'M' second data ports of the multiplexer, and wherein transmitting a control signal from the controller to the multiplexer comprises transmitting a control signal from the controller to the multiplexer to select a subset of a multiple of 'M' of the 'N' data lines in the internal bus to be coupled to the 'M' second data ports of the multiplexer.

3. The method of claim 1 wherein the integrated circuit includes an embedded logic array having 'N' data ports coupled to the 'N' data lines of the internal bus, and wherein providing a test circuit, transmitting a control signal, and coupling a data signal occur prior to the formation of the embedded logic array.

4. The method of claim 1 wherein providing a test circuit including a multiplexer having 'N' first data ports each coupled to a respective one of the N data lines of the internal bus and 'M' second data ports comprises providing a test circuit including a multiplexer having 'N' first data ports each coupled to a respective one of the N data lines of the internal bus and 'M' second data ports, where 'N' is equal to a power of two times 'M'.

5. The method of claim 1 wherein providing a test circuit including a multiplexer having 'N' first data ports each coupled to a respective one of the N data lines of the internal bus and 'M' second data ports comprises providing a test circuit including a multiplexer having 'N' first data ports each coupled to a respective one of the N data lines of the internal bus and 'M' second data ports, where 'M' has a value from one to sixty four inclusive.

6. The method of claim 1 wherein providing a test circuit including a multiplexer having 'N' first data ports each coupled to a respective one of the N data lines of the internal bus and 'M' second data ports comprises providing a test circuit including a multiplexer having 'N' first data ports each coupled to a respective one of the N data lines of the internal bus and 'M' second data ports, where 'M' is less than thirty two.

7. The method of claim 1, further comprising replacing portions of the embedded memory device with redundant memory cells by blowing fuses in a pattern corresponding to a pattern of defective memory cells in the embedded memory device.

8. The method of claim 1, further comprising repairing the embedded memory device.

9. The method of claim 8 wherein the integrated circuit includes an embedded logic array having 'N' data ports coupled to the 'N' data lines of the internal bus, and wherein repairing the embedded memory device occurs prior to the formation of the embedded logic array.

10. A method of testing an integrated circuit including an internal bus having 'N' data lines and an embedded memory device coupled to the internal bus, the method comprising:
providing a test circuit including a multiplexer having 'N' first data ports each coupled to a respective one of the 'N' data bus terminals and 'M' second data ports, where 'M' is less than 'N', and 'M' I/O ports each coupled to a respective one of the second data ports;
selecting a subset of 'M' of the 'N' data lines in the internal bus using the multiplexer to be coupled to the 'M' second data ports of the multiplexer; and
coupling a data signal from at least one of the 'M' second data ports of the multiplexer to a respective one of the 'M' I/O ports.

11. The method of claim 10 wherein providing a test circuit comprises providing a test circuit including a controller coupled to the multiplexer.

12. The method of claim 10 wherein selecting a subset of 'M' of the 'N' data lines comprises selecting a subset of 'M' of the 'N' data bus terminals to be coupled to the "M" second data ports in response to externally-supplied control signals.

13. The method of claim 10 wherein providing a test circuit including a multiplexer having 'N' first data ports each coupled to a respective one of the 'N' data bus terminals and 'M' second data ports comprises providing a test circuit including a multiplexer having 'N' first data ports each coupled to a respective one of the 'N' data bus terminals and 'M' second data ports wherein 'M' is less than thirty two.

14. The method of claim 10 wherein selecting a subset of 'M' of the 'N' data lines comprises selecting a subset of a multiple of 'M' of the 'N' data lines in the internal bus to be coupled to the 'M' second data ports of the multiplexer.

15. The method of claim 10 wherein at least one of the test circuit or the integrated circuit includes a data compression circuitry including 'N' ports coupled to the 'N' data bus terminals and 'M' ports coupled to the second data ports, and wherein selecting a subset of 'M' of the 'N' data lines comprises selecting a subset of a multiple of 'M' of the 'N' data lines in the internal bus to be coupled to the 'M' second data ports of the multiplexer.

16. The method of claim 10 wherein the integrated circuit includes an embedded logic array having 'N' data ports coupled to the 'N' data lines of the internal bus, and wherein providing a test circuit, selecting a subset, and coupling a data signal occur prior to the formation of the embedded logic array.

17. The method of claim 10, further comprising replacing defective memory cells of the matrix memory device with redundant memory cells by blowing a series of fuses in the integrated circuit.

18. The method of claim 10, further comprising repairing the embedded memory device.

19. The method of claim 18 wherein the integrated circuit includes an embedded logic array having 'N' data ports coupled to the 'N' data lines of the internal bus, and wherein repairing the embedded memory device occurs prior to the formation of the embedded logic array.

20. A method of testing an integrated circuit including an internal bus having 'N' data lines and an embedded memory device coupled to the internal bus, the method comprising:
providing a test circuit including 'N' first data ports each coupled to a respective one of the N data lines of the internal bus, and 'M' second data ports, where 'M' is less than 'N', and 'M' I/O ports each coupled to a respective one of the 'M' second data ports;
selecting a subset of 'M' of the 'N' data lines to be coupled to the 'M' second data ports; and
coupling a data signal from at least one of the 'M' second data ports to a respective one of the 'M' I/O ports.

21. The method of claim 20 wherein selecting a subset of 'M' of the 'N' data lines comprises selecting a subset of a multiple of 'M' of the 'N' data lines in the internal bus to be coupled to the 'M' second data ports.

22. The method of claim 20 wherein the integrated circuit includes an embedded logic array having 'N' data ports coupled to the 'N' data lines of the internal bus, and wherein providing a test circuit, selecting a subset, and coupling a data signal occur prior to the formation of the embedded logic array.

23. The method of claim 20 wherein providing a test circuit including 'N' first data ports comprises providing a test circuit including a multiplexer having 'N' first data ports each coupled to a respective one of the N data lines of the internal bus and 'M' second data ports, where 'M' is less than 'N'.

24. The method of claim 20 wherein providing a test circuit including 'N' first data ports comprises providing a test circuit including a multiplexer having 'N' first data ports each coupled to a respective one of the N data lines of the internal bus and 'M' second data ports, where 'N' is equal to a power of two times 'M'.

25. The method of claim 20 wherein providing a test circuit including 'N' first data ports comprises providing a test circuit including a multiplexer having 'N' first data ports each coupled to a respective one of the N data lines of the internal bus and 'M' second data ports, where 'M' has a value from one to sixty four inclusive.

26. The method of claim 20 wherein providing a test circuit including 'N' first data ports comprises providing a test circuit including a multiplexer having 'N' first data ports each coupled to a respective one of the N data lines of the internal bus and 'M' second data ports, where 'M' is less than thirty two.

27. The method of claim 20, further comprising replacing portions of the embedded memory device with redundant memory cells by blowing fuses in a pattern corresponding to a pattern of defective memory cells in the embedded memory device.

28. The method of claim 20, further comprising repairing the embedded memory device.

29. A method of testing an integrated circuit including an embedded memory device, comprising:
forming an embedded memory device in an integrated circuit;
coupling a test port to the embedded memory device;

selecting a group of index variables corresponding to addresses for a first group of rows of the embedded memory device;

coupling the selected rows to I/O pads with a preprogrammed multiplexer;

supplying background data to the selected rows;

extracting read data from at least some of the selected rows of the embedded memory device through the I/O pads;

determining if the read data and the corresponding background data agree; and determining if all columns in the embedded memory device have been tested.

30. The method of claim 29 wherein coupling a test port to the embedded memory device comprises making temporary connections with a plurality of I/O pads, electrically coupled to the embedded memory device, with a probe card having a number of probes.

31. The method of claim 29, wherein after determining if all columns in the embedded memory device have been tested, if the determination is made that all columns have been tested, the method further comprises determining if all rows in the embedded memory device have been tested.

32. The method of claim 31, wherein after determining if all rows in the embedded memory device have been tested, if the determination is made that all rows have not been tested, the method further comprises:

incrementing a row counter to select new rows;

coupling the new selected rows to the I/O pads with a preprogrammed multiplexer and supplying background data to the selected rows;

extracting read data from selected rows of the embedded memory device through the I/O pads;

determining if the read data and the corresponding background data agree, wherein upon determining that the read data and the corresponding background data do not agree, the method further comprises writing data describing a failed memory location to an automated tester; and accessing the column counter to determine if all columns in the embedded memory device have been tested.

33. The method of claim 31, wherein after determining if all rows in the embedded memory device have been tested, if the determination is made that all rows have been tested, the method further comprises:

replacing the defective memory locations in the embedded memory device by blowing fuses or antifuses in a pattern corresponding to addresses of rows or columns including the defective memory locations; and forming an embedded logic array and a remainder of the integrated circuit.

34. The method of claim 33, wherein forming an embedded logic array and a remainder of the integrated circuit occurs subsequent to replacing the defective memory locations.

35. The method of claim 33, wherein replacing the defective memory locations comprises replacing the several rows associated with an I/O pad carrying data indicative of a memory location failure with a group of rows from redundant memory locations.

* * * * *

UNITED STATES PATENT AND TRADEMARK OFFICE
CERTIFICATE OF CORRECTION

PATENT NO.    : 6,581,174 B2
DATED         : June 17, 2003
INVENTOR(S)   : Eric T. Stubbs It is certified that error appears in the above-identified patent and that said Letters Patent is hereby corrected as shown below:

Title page,
Item [*] Notice, reads "Subject to any disclaimer, the term of this patent is extended or adjusted under 35 U.S.C. 154(b) by 0 days." should read -- Subject to any disclaimer, the term of this patent is extended or adjusted under 35 U.S.C. 154(b) by 6 days. --

Signed and Sealed this

Twenty-eighth Day of September, 2004

JON W. DUDAS
*Director of the United States Patent and Trademark Office*